US012656418B2

(12) United States Patent (10) Patent No.: US 12,656,418 B2

Shino (45) Date of Patent: Jun. 16, 2026

(54) MAGNETIC SENSOR

(71) Applicant: SHOWA DENKO K.K., Tokyo (JP)

(72) Inventor: Tatsunori Shino, Ichihara (JP)

(73) Assignee: Resonac Corporation, Tokyo (JP)

( * ) Notice: Subject to any disclaimer, the term of this patent is extended or adjusted under 35 U.S.C. 154(b) by 216 days.

(21) Appl. No.: 17/755,985

(22) PCT Filed: Aug. 17, 2020

(86) PCT No.: PCT/JP2020/031014

§ 371 (c)(1),
(2) Date: May 13, 2022

(87) PCT Pub. No.: WO2021/095310

PCT Pub. Date: May 20, 2021

(65) Prior Publication Data

US 2022/0390531 A1 Dec. 8, 2022

(30) Foreign Application Priority Data

Nov. 14, 2019 (JP) ................................. 2019-206490

(51) Int. Cl.
*G01R 33/06* (2006.01)
(52) U.S. Cl.
CPC .................................. *G01R 33/063* (2013.01)
(58) Field of Classification Search
CPC ............ G01R 33/0041; G01R 33/0052; G01R
33/038; G01R 33/063; G01R 33/093;
(Continued)

(56) References Cited

U.S. PATENT DOCUMENTS 6,222,361 B1 * 4/2001 Shimano ................ G01R 33/09
324/252
2008/0169807 A1 7/2008 Naito et al.
(Continued)

FOREIGN PATENT DOCUMENTS

JP 2004-264215 A 9/2004
JP 2006-275538 A 10/2006
(Continued)

OTHER PUBLICATIONS

International Search Report for PCT/JP2020/031014 dated Nov. 10, 2020 [PCT/ISA/210].

*Primary Examiner* — Judy Nguyen
*Assistant Examiner* — Brent J Andrews
(74) *Attorney, Agent, or Firm* — Sughrue Mion, PLLC

(57) ABSTRACT

A magnetic sensor 1 includes a plurality of sensitive elements 31 made of a soft magnetic material. The sensitive elements 31 have a longitudinal direction and a transverse direction and have a uniaxial magnetic anisotropy in a direction intersecting the longitudinal direction. The sensitive elements 31 are configured to sense a magnetic field by a magnetic impedance effect. The sensitive elements 31 are arranged with a gap in between in the transverse direction. The magnetic sensor 1 includes a connecting portion 32 configured to connect longitudinal ends of transversely adjacent ones of the sensitive elements 31. The connecting portion 32 has a width in the transverse direction that narrows as the connecting portion 32 approaches the ones of the sensitive elements 31 along the longitudinal direction.

7 Claims, 7 Drawing Sheets

(58) Field of Classification Search
CPC ... G01R 1/00; G01R 3/00; G01R 5/00; G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00
See application file for complete search history.

(56) References Cited

U.S. PATENT DOCUMENTS

| | | | |
|---|---|---|---|
| 2008/0204011 A1 | 8/2008 | Shoji | |
| 2009/0027048 A1 | 1/2009 | Sato et al. | |
| 2009/0066326 A1* | 3/2009 | Itoi | G01R 33/063 |
| | | | 324/260 |
| 2012/0268113 A1 | 10/2012 | Sato et al. | |
| 2012/0272514 A1 | 11/2012 | Naito et al. | |
| 2014/0354377 A1* | 12/2014 | Gupta | H01G 4/38 |
| | | | 336/206 |
| 2021/0373093 A1* | 12/2021 | Endo | H10N 50/00 |

FOREIGN PATENT DOCUMENTS

| | | | | |
|---|---|---|---|---|
| JP | 2007-042772 A | 2/2007 | | |
| JP | 2008-209311 A | 9/2008 | | |
| JP | 2008-249406 A | 10/2008 | | |
| JP | 2014-089088 A | 5/2014 | | |
| JP | 2020085766 | * 11/2018 | ......... | G01R 33/0011 |
| WO | 2012/172946 A1 | 12/2012 | | |

* cited by examiner

MAGNETIC SENSOR

CROSS REFERENCE TO RELATED APPLICATION

This application is a National Stage of International Application No. PCT/JP2020/031014 filed Aug. 17, 2020, claiming priority based on Japanese Patent Application No. 2019-206490 filed Nov. 14, 2019.

TECHNICAL FIELD

The present invention relates to a magnetic sensor.

BACKGROUND ART

A previous publication in the art discloses a magnetic impedance effect element including sensitive portions composed of a plurality of rectangular soft magnetic material films with uniaxial anisotropy (see Patent Document 1). In this magnetic impedance effect element, the plurality of sensitive portions are connected in series via conductor films.

CITATION LIST

Patent Literature

Patent Document 1: Japanese Patent Application Laid-Open Publication No. 2008-249406

SUMMARY OF INVENTION

Technical Problem

A magnetic sensor configured to sense a magnetic field using sensitive elements may, for example, have the plurality of sensitive elements connected in series in a serpentine pattern via connecting portions, in order to improve the sensitivity of the magnetic sensor while reducing its size. Sensitivity of such a magnetic sensor in which a plurality of sensitive elements are connected may vary depending on the shape of connecting portions connecting the sensitive elements.

It is an object of the present invention to improve the sensitivity of the magnetic sensor that uses a magnetic impedance effect, as compared to when the connecting portions connecting the sensitive elements are of a rectangular shape.

Solution to Problem

A magnetic sensor according to an aspect of the present invention includes a plurality of sensitive elements made of a soft magnetic material. The plurality of sensitive element have a longitudinal direction and a transverse direction and have a uniaxial magnetic anisotropy in a direction intersecting the longitudinal direction. The plurality of sensitive elements are configured to sense a magnetic field by a magnetic impedance effect. The plurality of sensitive elements are arranged with a gap in between in the transverse direction. The magnetic sensor includes a connecting portion configured to connect longitudinal ends of transversely adjacent ones of the plurality of sensitive elements. The connecting portion has a width in the transverse direction that narrows as the connecting portion approaches the ones of the plurality of sensitive elements along the longitudinal direction.

In the above magnetic sensor, the connecting portion may include: an extended portion extending along the transverse direction, the extended portion protruding in the transverse direction relative to the ones of the plurality of sensitive elements; and a tapered portion extending in the longitudinal direction from the extended portion toward the ones of the plurality of sensitive elements, the tapered portion having a width in the transverse direction that narrows as the tapered portion approaches the ones of the plurality of sensitive elements. This facilitates the gathering of magnetic lines force at the sensitive elements as compared to when the extended portion of the connecting portion does not protrude in the transverse direction relative to the sensitive elements.

In the above magnetic sensor, the extended portion of the connecting portion may have a width in the longitudinal direction that is equal to or larger than a width of each of the plurality of sensitive elements in the transverse direction. This can reduce the resistance at the connecting portion as compared to when the width of the extended portion in the longitudinal direction is smaller than the width of the sensitive element in the transverse direction. However, when a material with higher conductivity than the sensitive element is used for the extended portion, the width of the extended portion in the longitudinal direction does not have to be equal to or larger than the width of the sensitive element in the transverse direction because using such a material can reduce the resistance at the connecting portion.

The above magnetic sensor may include a plurality of the connecting portions. The plurality of sensitive elements may be connected by the plurality of the connecting portions in series in a serpentine pattern, and each connecting portion of the plurality of the connecting portions may have a width in the transverse direction that narrows as the connecting portion approaches corresponding ones of the plurality of sensitive elements along the longitudinal direction. This can improve the sensitivity of the magnetic sensor while reducing the size thereof in the longitudinal direction.

A magnetic sensor according to another aspect of the present invention includes a plurality of sensitive elements made of a soft magnetic material. The plurality of sensitive elements have a longitudinal direction and a transverse direction and have a uniaxial magnetic anisotropy in a direction intersecting the longitudinal direction. The plurality of sensitive elements are configured to sense a magnetic field by a magnetic impedance effect. The plurality of sensitive elements are arranged with a gap in between in the transverse direction. The magnetic sensor includes a connecting portion configured to connect longitudinal ends of transversely adjacent ones of the plurality of sensitive elements. The connecting portion protrudes in the transverse direction relative to the ones of the plurality of sensitive elements that the connecting portion connects.

Advantageous Effects of Invention

The present invention can improve the sensitivity of the magnetic sensor that uses a magnetic impedance effect, as compared to when the connecting portions connecting the sensitive elements are of a rectangular shape.

DESCRIPTION OF EMBODIMENTS

An exemplary embodiment of the present invention will be described below with reference to the attached drawings.

Figure 1:
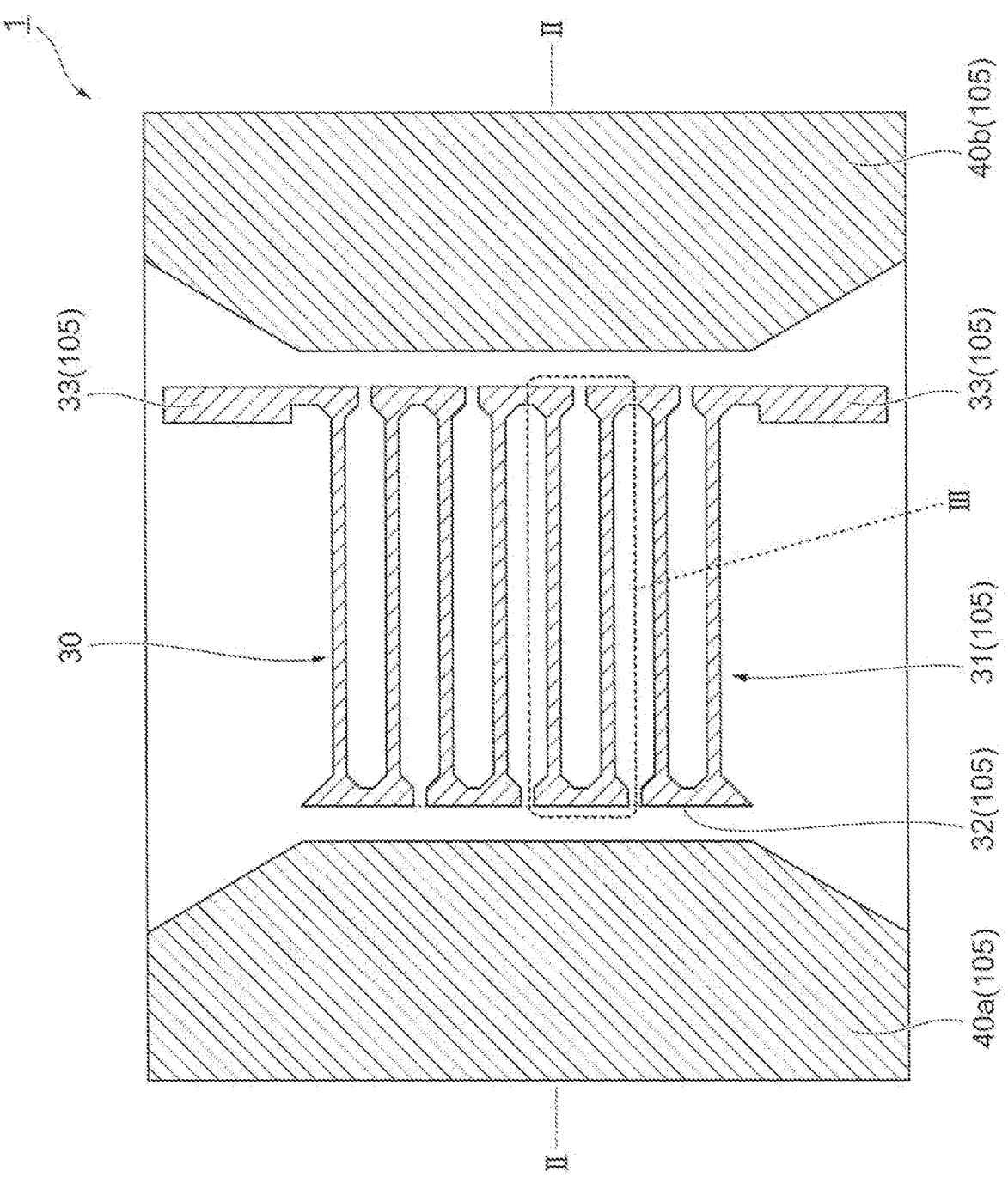
FIG. 1 illustrates an exemplary magnetic sensor according to an embodiment.
Figure 2:
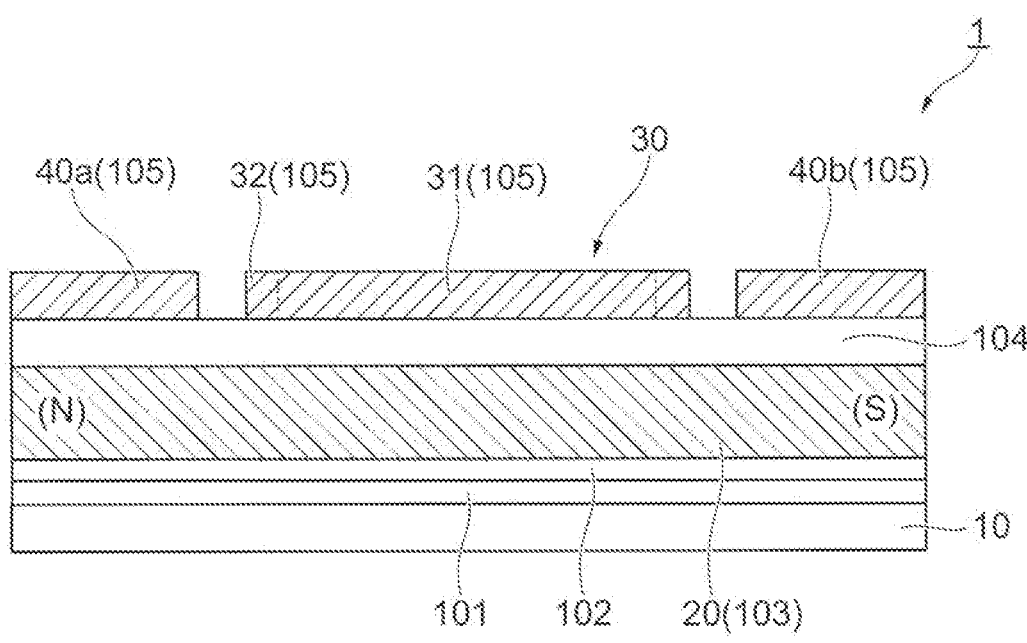
FIG. 2 illustrates the exemplary magnetic sensor according to the embodiment.
Figure 3:
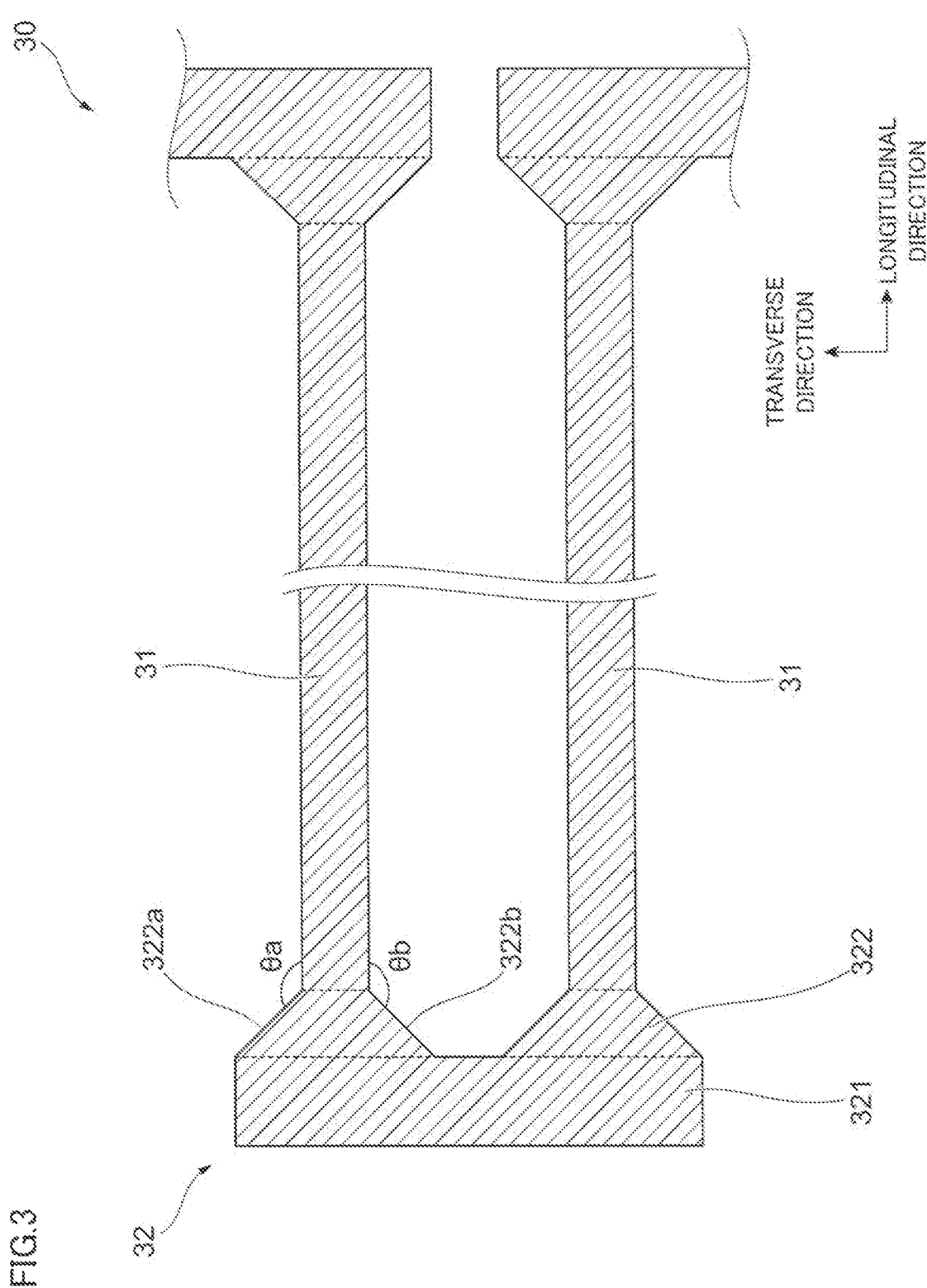
FIG. 3 illustrates the exemplary magnetic sensor according to the embodiment.

FIGS. 1 to 3 illustrate an exemplary magnetic sensor 1 according to the present embodiment; FIG. 1 is a plan view, FIG. 2 is a cross-sectional view along the II-II line in FIG. 1, and FIG. 3 is an enlarged view of the part III in FIG. 1.

As shown in FIG. 2, the magnetic sensor 1 according to the present embodiment includes a thin-film magnet 20 disposed on a non-magnetic substrate 10 and made of a hard magnetic material (hard magnetic material layer 103), and a sensitive portion 30 laminated to face the thin-film magnet 20 and made of a soft magnetic material (soft magnetic material layer 105) to sense a magnetic field. A cross-sectional structure of the magnetic sensor 1 will be detailed in subsequent paragraphs.

The hard magnetic material refers to a so-called high coercivity material that, once being magnetized by an external magnetic field, keeps its magnetized state even after removal of the external magnetic field. The soft magnetic material refers to a so-called low coercivity material that is easily magnetizable by an external magnetic field but quickly returns to a non-magnetized or low magnetized state upon removal of the external magnetic field.

Herein, elements constituting the magnetic sensor 1 (e.g., thin-film magnet 20) is denoted by two-digit reference numerals, and layers processed into these elements (e.g., hard magnetic material layer 103) are denoted by reference numerals in the 100s. And the reference numeral for each layer processed into a corresponding element is placed in parentheses following the reference numeral for the corresponding element. For example, the thin-film magnet 20 is denoted like "the thin-film magnet 20 (hard magnetic material layer 103)". In the figures, the reference numerals are presented like "20(103)". This holds for other elements.

Referring to FIG. 1, a planar structure of the magnetic sensor 1 is described. By way of example, the magnetic sensor 1 has a square planar shape. Here, a description is given of the sensitive portion 30 and yokes 40 formed in the uppermost part of the magnetic sensor 1. The sensitive portion 30 includes: a plurality of sensitive elements 31 each being of a strip-like planar shape having longitudinal and transverse directions; connecting portions 32 connecting respective adjacent sensitive elements 31 in series in a serpentine pattern; and terminal portions 33 connected with electric wires for electric current supply. In the shown example, eight sensitive elements 31 are arranged such that their longitudinal directions are parallel to each other with gaps therebetween in the transverse direction. In the magnetic sensor 1 of the present embodiment, the sensitive elements 31 are magnetic impedance effect elements.

Each connecting portion 32 is disposed between longitudinal ends of respective adjacent sensitive elements 31 to connect the respective adjacent sensitive elements 31 in series in a serpentine pattern. As the magnetic sensor 1 shown in FIG. 1 includes eight sensitive elements 31 arranged in parallel, there are seven connecting portions 32.

A planar shape of the connecting portions 32 will be detailed in subsequent paragraphs.

The terminal portions 33 are disposed at two respective ends of the sensitive elements 31 that are not connected with any connecting portion 32. Each terminal portion 33 includes a lead-out portion led out from the sensitive element 31 and pad portions to be connected with electric wires for electric current supply. The lead-out portion is provided to arrange the two pad portions in the transverse direction of the sensitive element 31. The pad portions may be arranged continuous with the sensitive element 31 without the lead-out portion. The pad portions may have a size that allows for connection of the electric wires. Since there are eight sensitive elements 31, the two terminal portions 33 are arranged on the right side in FIG. 1. When the sensitive elements 31 are odd in number, the two terminal portions 33 may be arranged respectively on the right and left sides.

The sensitive elements 31, the connecting portions 32, and the terminal portions 33 of the sensitive portion 30 are integrally formed of a single soft magnetic material layer 105. As the soft magnetic material layer 105 is conductive, electric currents can be passed from one terminal portion 33 to the other terminal portion 33.

Note that the length and width of each sensitive element 31 and the number of sensitive elements 31 arranged in parallel described above are merely exemplary, and these parameters may be modified according to factors such the value of the magnetic field to be sensed (measured) and the soft magnetic material to be used.

The magnetic sensor 1 further includes the yokes 40 facing longitudinal ends of the sensitive elements 31. In this example, the magnetic sensor 1 includes two yokes 40a, 40b facing respective longitudinal ends of each sensitive element 31. Hereinafter, the yokes 40a, 40b may be simply referred to as the yokes 40 unless the distinction is necessary. The yokes 40 induce magnetic lines of force to the longitudinal ends of the sensitive elements 31. Hence, the yokes 40 are made of a soft magnetic material (soft magnetic material layer 105) that easily transmits the magnetic lines of force. That is, the sensitive portion 30 and the yokes 40 are composed of the single soft magnetic material layer 105. Note that the yokes 40 may be eliminated when the magnetic lines of force can sufficiently pass through the sensitive elements 31 in the longitudinal direction thereof.

From the above, the magnetic sensor 1 is several millimeters square in planar shape. Note that the size of the magnetic sensor 1 is not limited to this value.

Referring now to FIG. 2, a cross-sectional structure of the magnetic sensor 1 is described. The magnetic sensor 1 is composed of the non-magnetic substrate 10 and a lamination of an adhesive layer 101, a control layer 102, the thin-film magnet 20 formed of the hard magnetic material layer 103, a dielectric layer 104, and the sensitive portion 30 and the yokes 40 formed of the soft magnetic material layer 105, which are laminated in this order on the substrate 10.

The substrate 10 is made of a non-magnetic material. Examples of the substrate 10 include an oxide substrate such as glass and sapphire, a semiconductor substrate such as silicon, and a metal substrate such as aluminum, stainless steel, and a metal plated with nickel phosphorus.

The adhesive layer 101 increases adhesiveness of the control layer 102 to the substrate 10. The adhesive layer 101 may be made of an alloy containing Cr or Ni. Examples of the alloy containing Cr or Ni include CrTi, CrTa, and NiTa. The adhesive layer 101 is from 5 nm to 50 nm thick, for example. Note that the adhesive layer 101 may be eliminated when the control layer 102 has sufficient adhesiveness to the substrate 10. Also note that the composition ratio of the alloy containing Cr or Ni will not be described herein. This holds for other alloys given below.

The control layer 102 controls the magnetic anisotropy of the thin-film magnet 20, which is formed of the hard magnetic material layer 103, such that the magnetic anisotropy develops in an in-plane direction of the film. The control layer 102 may be made of Cr, Mo, W, or an alloy containing at least one of these metals (hereinafter referred to as an alloy containing Cr or the like constituting the control layer 102). Examples of the alloy containing Cr or the like constituting the control layer 102 include CrTi, CrMo, CrV, and CrW. The control layer 102 is from 10 nm to 300 nm thick, for example.

The hard magnetic material layer 103 constituting the thin-film magnet 20 may be a Co-based alloy containing either Cr or Pt or both (hereinafter referred to as a Co alloy constituting the thin-film magnet 20). Examples of the Co alloy constituting the thin-film magnet 20 include CoCrPt, CoCrTa, CoNiCr, and CoCrPtB. The Co alloy constituting the thin-film magnet 20 may also contain Fe. The hard magnetic material layer 103 is from 1 μm to 3 μm thick, for example.

The alloy containing Cr or the like constituting the control layer 102 has a body-centered cubic (bcc) structure. Thus, the hard magnetic material (hard magnetic material layer 103) constituting the thin-film magnet 20 preferably has a hexagonal close-packed (hcp) structure, which facilitates crystal growth on the control layer 102 composed of the alloy containing Cr or the like having the bcc structure. Such crystal growth, on the bcc structure, of the hard magnetic material layer 103 having the hcp structure can easily cause a c-axis of the hcp structure to be oriented in the in-plane direction. Consequently, the thin-film magnet 20, which is composed of the hard magnetic material layer 103, can easily have the magnetic anisotropy in the in-plane direction. Note that the hard magnetic material layer 103 has a polycrystalline structure composed of a group of differently oriented crystallites, and each crystallite has magnetic anisotropy in the in-plane direction. This magnetic anisotropy is derived from magneto-crystalline anisotropy.

To facilitate the crystal growth of the alloy containing Cr or the like constituting the control layer 102 and the Co alloy constituting the thin-film magnet 20, the substrate 10 may be heated to 100° C. to 600° C. This heating facilitates the crystal growth of the alloy containing Cr or the like constituting the control layer 102 and thus facilitates the crystal orientation of the hard magnetic material layer 103 so as to yield an easy axis of magnetization in the plane of the hard magnetic material layer 103 having the hcp structure. In other words, the heating facilitates impartation of the in-plane magnetic anisotropy to the hard magnetic material layer 103.

The dielectric layer 104 is made of a non-magnetic dielectric and provides electrical insulation between the thin-film magnet 20 and the sensitive portion 30. Examples of the dielectric constituting the dielectric layer 104 include oxides such as $SiO_2$, $Al_2O_3$ and $TiO_2$ and nitrides such as $Si_3N_4$ and AlN. The dielectric layer 104 is from 0.1 μm to 30 μm thick, for example.

Each sensitive element 31 of the sensitive portion 30 is provided with uniaxial magnetic anisotropy in a direction intersecting the longitudinal direction, e.g., in the transverse direction (i.e., width direction of the sensitive element 31) perpendicular to the longitudinal direction. Note that the direction intersecting the longitudinal direction may be a direction angled at 45 degrees or more with respect to the longitudinal direction.

The soft magnetic material layer 105 constituting the sensitive portion 30 may be made of a Co-based amorphous alloy doped with a high melting point metal such as Nb, Ta, or W (hereinafter referred to as a Co alloy constituting the sensitive portion 30). Examples of the Co alloy constituting the sensitive portion 30 include CoNbZr, CoFeTa, and CoWZr. While the sensitive elements 31, the connecting portions 32, and the terminal portions 33 of the sensitive portion 30 are made of the same material in the present embodiment, these may be made of different materials. For example, the connecting portions 32 and the terminal portions 33 may be made of a material having higher conductivity than a material of the sensitive elements 31. This can reduce the resistance at the connecting portions 32 and the terminal portions 33.

The adhesive layer 101, the control layer 102, the hard magnetic material layer 103, and the dielectric layer 104 are processed to have a square planar shape (see FIG. 1). Two opposing exposed sides of the thin-film magnet 20 are the north pole ((N) in FIG. 2) and the south pole ((S) in FIG. 2). A line connecting the north and south poles of the thin-film magnet 20 is oriented in the longitudinal direction of the sensitive element 31. The phrase "oriented in the longitudinal direction" means that the line connecting the north and south poles is angled at 45 degrees or less with respect to the longitudinal direction. The smaller the angle between the line connecting the north and south poles and the longitudinal direction, the better.

In the magnetic sensor 1, magnetic lines of force emanating from the north pole of the thin-film magnet 20 once exit from the magnetic sensor 1. Then, some of the magnetic lines of force pass through the sensitive elements 31 via the yoke 40a and again exit from the magnetic sensor 1 via the yoke 40b. Thus, the magnetic lines of force having passed through the sensitive elements 31 return to the south pole of the thin-film magnet 20 together with other magnetic lines of force that have not passed through the sensitive elements 31. In other words, the thin-film magnet 20 applies a magnetic field (bias magnetic field Hb described below) in the longitudinal direction of the sensitive elements 31.

Note that the north and south poles of the thin-film magnet 20 are hereinafter collectively referred to as "both magnetic poles", and each of the north and south poles is hereinafter referred to as a "magnetic pole" unless the distinction is necessary.

As shown in FIG. 1, when viewed from the top side of the substrate 10, each of the yokes 40 (yokes 40a, 40b) has a shape that narrows as it approaches the sensitive portion 30. This shape is intended to concentrate the magnetic field (gather the magnetic lines of force) at the sensitive portion 30. In other words, this shape helps further improve the sensitivity by enhancing the magnetic field at the sensitive portion 30. Note that the yokes 40 (yokes 40a, 40b) are not necessarily narrowed at the portions thereof facing the sensitive portion 30.

A distance between each of the yokes 40 (yokes 40a, 40b) and the sensitive portion 30 may be from 1 μm to 100 μm, for example.

A planar shape of the connecting portions 32 is now described in detail. FIG. 3 is an enlarged view of the part III in FIG. 1. As shown in FIG. 3, each of the connecting portions 32 includes an extended portion 321 extending along the transverse direction. When referring simply to "transverse direction" or "longitudinal direction" herein, it is intended to refer to the transverse direction or the longitudinal direction of the sensitive elements 31. Each of the connecting portions 32 further includes tapered portions 322 each extending in the longitudinal direction from the extended portion 321 and connecting the corresponding longitudinal end of the sensitive element 31 and the extended portion 321. Thus, the connecting portion 32 connects the longitudinal ends of the two sensitive elements 31 arranged in the transverse direction by the extended portion 321 and the two tapered portions 322.

The extended portion 321 has a strip-like shape extending along the transverse direction. As shown in FIG. 3, the extended portion 321 protrudes in the transverse direction relative to the two sensitive elements 31 it connects. To further illustrate, the length of the extended portion 321 in the transverse direction is longer than the combined length of the widths of the two sensitive elements 31 in the transverse direction and the gap between the two sensitive elements 31 in the transverse direction.

Additionally, it is preferred that the width of the extended portion 321 in the longitudinal direction be larger than the width of each sensitive element 31 in the transverse direction. This reduces the resistance when supplying current to the sensitive portion 30, as compared to the case where the width of the extended portion 321 in the longitudinal direction is smaller than the width of the sensitive element 31 in the transverse direction.

Each tapered portion 322 has a so-called tapered shape whose width in the transverse direction narrows as it approaches the corresponding end of the sensitive element 31 along the longitudinal direction. To further illustrate, the tapered portion 322 includes two sides 322a, 322b extending along the longitudinal direction. A distance between the two sides 322a, 322b reduces as the tapered portion 322 approaches the corresponding end of the sensitive element 31 along the longitudinal direction.

Additionally, in this example, inclination angles θa, θb between the respective sides 322a, 322b of the tapered portion 322 and the longitudinal direction are each 135 degrees. The inclination angles θa, θb may vary depending on the length of the extended portion 321 in the transverse direction, the width of the sensitive element 31 in the transverse direction, and other parameters, but may be from 110 to 150 degrees, for example.

Further, as shown in FIG. 1, in the magnetic sensor 1 of the present embodiment, the connecting portions 32 located at the most opposite sides in the transverse direction have differently shaped extended portions 321 (see FIG. 3). Specifically, the uppermost connecting portion 32 in FIG. 1 includes the extended portion 321 having an upward-pointing triangle shape such that the extended portion 321 is continuous with the upper side 322a (see FIG. 3) of the tapered portion 322. Likewise, the lowermost connecting portion 32 in FIG. 1 includes the extended portion 321 having a downward-pointing triangle shape such that the extended portion 321 is continuous with the lower side 322b (see FIG. 3) of the tapered portion 322.

(Functions of the Magnetic Sensor 1)

Functions of the magnetic sensor 1 of the present embodiment are now described relative to a conventional magnetic sensor having differently shaped connecting portions 32 than the magnetic sensor 1 of the present embodiment (hereinafter referred to as a "conventional magnetic sensor").

Figure 4:
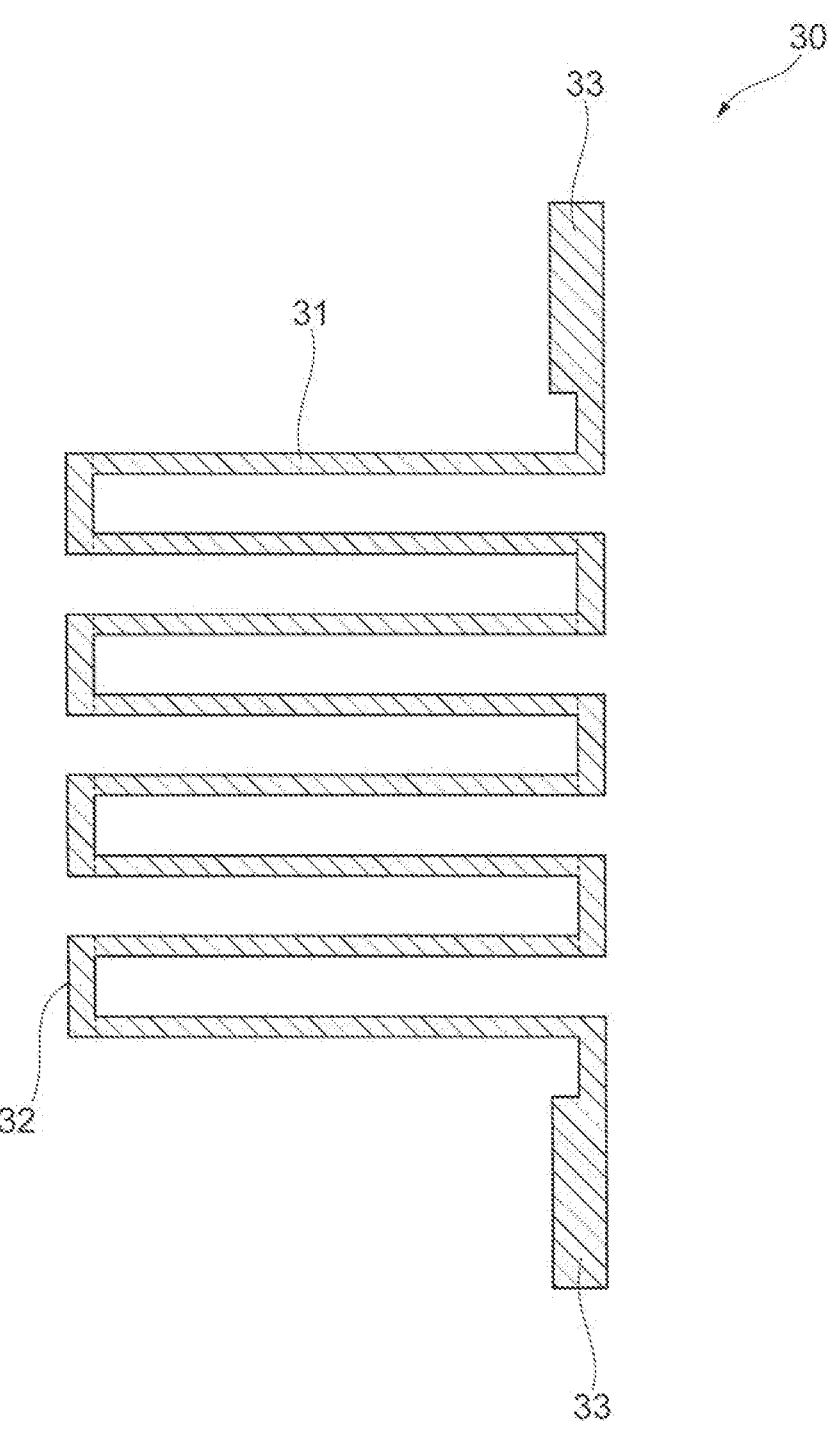
FIG. 4 illustrates an exemplary shape of a sensitive portion of a conventional magnetic sensor.

FIG. 4 illustrates an exemplary shape of a sensitive portion 30 of the conventional magnetic sensor. The conventional magnetic sensor shown in FIG. 4 has a similar structure to that of the magnetic sensor 1 of the present embodiment shown in FIGS. 1 to 3, except for the shape of the connecting portions 32. In FIG. 4 and the following description, parts common to the magnetic sensor 1 of the present embodiment and the conventional magnetic sensor are given the same reference numerals.

The connecting portions 32 of the conventional magnetic sensor shown in FIG. 4 have a strip-like shape that simply extends in the transverse direction and do not include the tapered portions 322 unlike the magnetic sensor 1 of the present embodiment. Also, in the conventional magnetic sensor, the length of each connecting portion 32 in the transverse direction is equal to the combined length of the widths in the transverse direction of the two sensitive elements 31 it connects and the gap between the two sensitive elements 31 in the transverse direction. Thus, unlike the magnetic sensor 1 of the present embodiment, the connecting portion 32 of the conventional magnetic sensor does not protrude in the transverse direction relative to the two sensitive elements 31 it connects.

Figure 5:
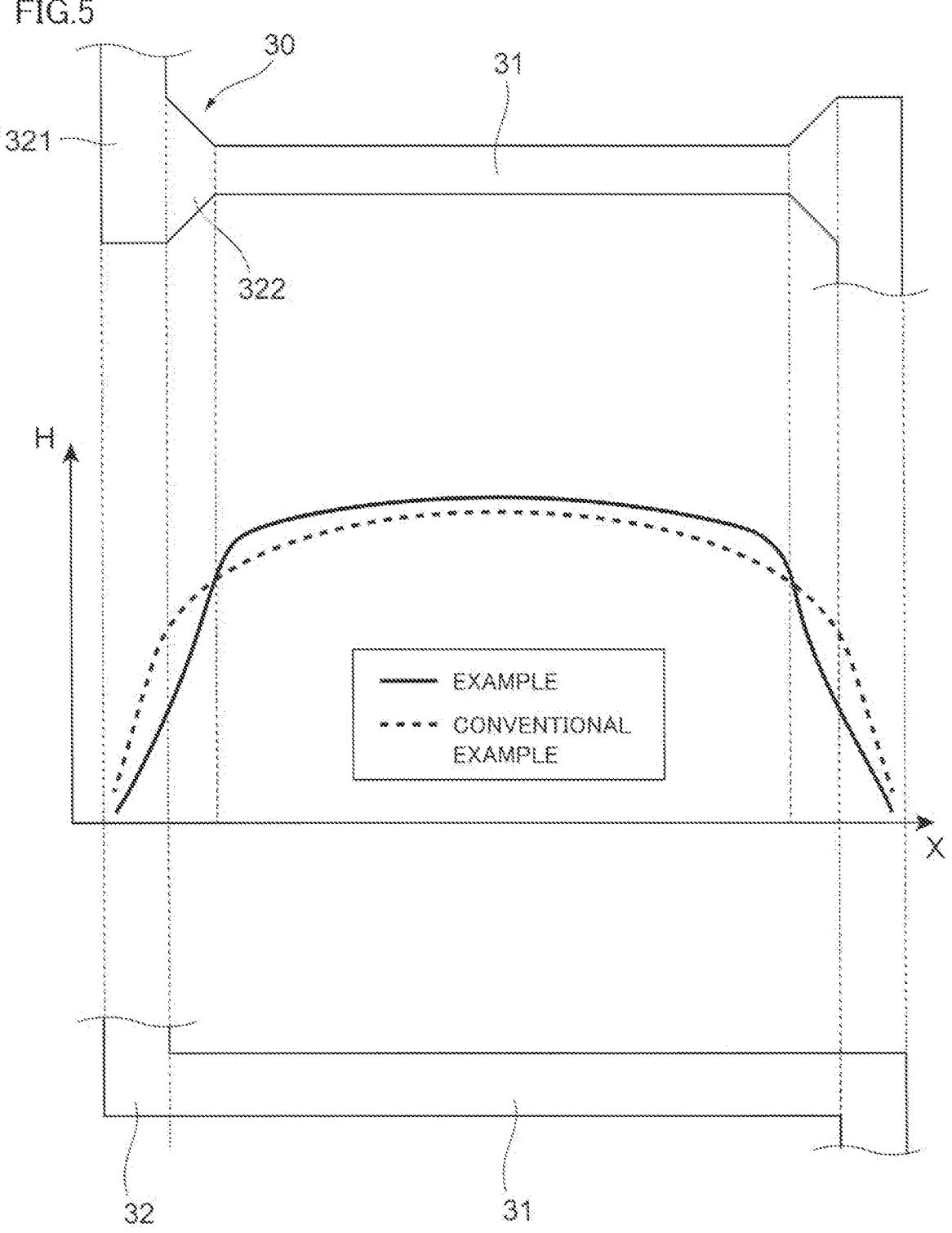
FIG. 5 illustrates the magnitude of a magnetic field across the sensitive portion when an external magnetic field of a predetermined magnitude is applied to the sensitive portion of the magnetic sensor and the conventional magnetic sensor.

FIG. 5 illustrates the magnitude of a magnetic field across the sensitive portion 30 when an external magnetic field of a predetermined magnitude is applied to the sensitive portion 30 of the magnetic sensor 1 and the conventional magnetic sensor. In FIG. 5, the magnitude of the magnetic field across the sensitive portion 30 is shown as a distribution along the longitudinal direction. In FIG. 5, the magnetic sensor 1 of the present embodiment and the conventional magnetic sensor are respectively denoted as "Example" and "Conventional Example." FIG. 5 also shows the shapes of the sensitive element 31 and the connecting portion 32 of the magnetic sensor 1 of the present embodiment and the conventional magnetic sensor, in addition to the magnitude of the magnetic field across the sensitive portion 30.

The magnitude of the magnetic field shown in FIG. 5 was obtained by computer-based simulation. Specifically, the magnetic sensor 1 of the present embodiment having the shape shown in FIGS. 1 to 3 was configured as follows: the sensitive portion 30 and the yokes 40 were composed of the soft magnetic material layer 105 made of $Co_{85}Nb_{12}Zr_3$ with a thickness of 1.5 μm, the length of the sensitive element 31 in the longitudinal direction was set to 1 mm, the width of the sensitive element 31 in the transverse direction was set to 100 μm, the width of the extended portion 321 of the connecting portion 32 in the longitudinal direction was set to 100 μm, the length of the tapered portion 322 of the connecting portion 32 in the longitudinal direction was set to 100 μm, and the angles between the respective sides 322a, 322b of the tapered portion 322 and the longitudinal direction were each set to 135 degrees. The magnitude of the magnetic field across the sensitive portion 30 upon application thereto of an external magnetic field of 10 Oe was calculated by simulation. The conventional magnetic sensor was configured similarly to the magnetic sensor 1 of the present embodiment except that the connecting portion 32 was given a strip-like shape as shown in FIG. 4 and the width of the connecting portion 32 in the longitudinal direction was set to 100 μm. The magnitude of the magnetic field across the sensitive portion 30 of the thus configured conventional magnetic sensor upon application thereto of an external magnetic field of 10 Oe was calculated by simulation.

As shown in FIG. 5, the magnitude of the magnetic field across the sensitive elements 31 of the sensitive portion 30 of the magnetic sensor 1 of the present embodiment, whose connecting portions 32 are each composed of the extended portion 321 and the tapered portions 322, is uniform across the longitudinal direction, as compared to the conventional magnetic sensor, whose connecting portions 32 are of a strip-like shape. Also, as shown in FIG. 5, an average value of the magnetic field across the sensitive elements 31 of the magnetic sensor 1 of the present embodiment is large as compared to the conventional magnetic sensor.

In the magnetic sensor 1 of the present embodiment, the extended portion 321 of the connecting portion 32 protrudes in the transverse direction relative to the corresponding sensitive elements 31 it connects. This facilitates the gathering of magnetic lines of force at the connecting portion 32 from a wider area in the transverse direction. Additionally, by virtue of the connecting portion 32 having the tapered portions 322, the magnetic sensor 1 of the present embodiment facilitates the induction of magnetic lines of force into the longitudinal end of the sensitive element 31.

As a result, in the magnetic sensor 1 of the present embodiment, the magnetic field concentrates at the sensitive elements 31 as shown in FIG. 5, producing a higher magnetic flux density. As such, the magnitude of the magnetic field across the sensitive elements 31 is uniform across the longitudinal direction, and also the average value of the magnetic field across the sensitive elements 31 is large.

In the magnetic sensor 1 of the present embodiment, the magnitude of the magnetic field is small at the connecting portions 32 located at the respective longitudinal ends of the sensitive element 31 as compared to the conventional magnetic sensor, as shown in FIG. 5. However, such a small magnitude of the magnetic field at the connecting portions 32 is unlikely to be problematic, because it is the magnitude of the magnetic field at the sensitive element 31 that contributes to the sensitivity of the magnetic sensor 1.

Figure 6:
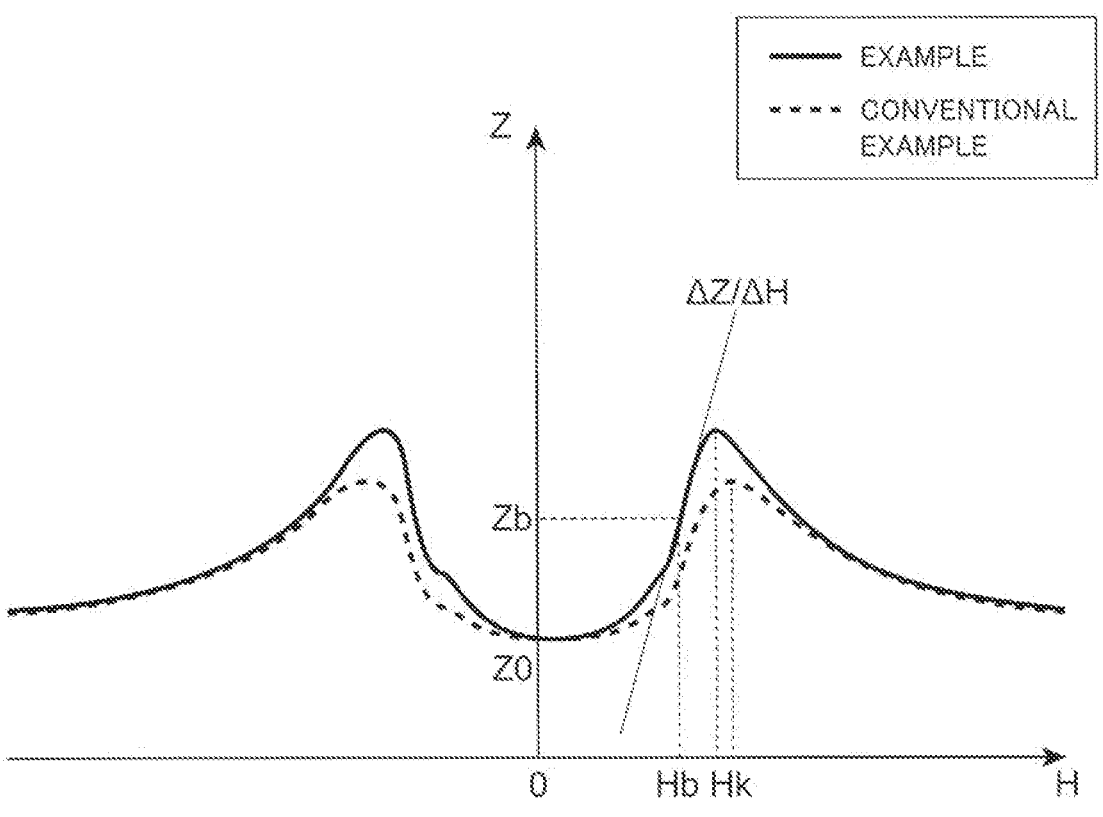
FIG. 6 illustrates relationship between the magnetic field applied in the longitudinal direction of sensitive elements and an impedance of the sensitive portion for the magnetic sensor of the present embodiment and the conventional magnetic sensor.

For the purpose of illustrating functions of the magnetic sensor 1 of the present embodiment, relationship between the magnetic field applied in the longitudinal direction of the sensitive elements 31 of the sensitive portion 30 in the magnetic sensor 1 and an impedance of the sensitive portion 30 is now described relative to the conventional magnetic sensor. FIG. 6 illustrates relationship between the magnetic field applied in the longitudinal direction of the sensitive elements 31 and an impedance of the sensitive portion 30 for the magnetic sensor 1 of the present embodiment and the conventional magnetic sensor. In FIG. 6, the horizontal axis represents the magnetic field H, and the vertical axis represents the impedance Z. The impedance Z of the sensitive portion 30 is measured by passing a high-frequency current between the two terminal portions 33. The impedance Z shown in FIG. 6 was measured by passing a high-frequency current of 100 MHz between the terminal portions 33 of the sensitive portion 30 in the magnetic sensor 1 of the present embodiment and in the conventional magnetic sensor. In FIG. 6, the magnetic sensor 1 of the present embodiment and the conventional magnetic sensor are respectively denoted as "Example" and "Conventional Example." Note that the constituent materials and shapes of the magnetic sensor 1 and the conventional magnetic sensor are the same as those of the magnetic sensor 1 and the conventional magnetic sensor whose characteristics have been shown in FIG. 5.

As shown in FIG. 6, in the magnetic sensor 1 (and in the conventional magnetic sensor), the impedance Z of the sensitive portion 30 changes from increasing to decreasing as the absolute value of the magnetic field H increases in the positive direction or negative direction with respect to the magnetic field H of zero (H=O). Also, an amount of change in the impedance Z relative to a change in the magnetic field H (i.e., the slope of the graph) varies depending on the magnitude of the magnetic field H.

Hence, by use of a portion where the amount of change $\Delta Z$ in the impedance Z relative to the amount of change $\Delta H$ in the applied magnetic field H is steep (i.e., a portion where $\Delta Z/\Delta H$ is large), a slight change in the magnetic field H can be extracted as the amount of change $\Delta Z$ in the impedance Z. In FIG. 6, the magnetic field H at which the amount of impedance change $\Delta Z$ relative to the amount of change $\Delta H$ in the magnetic field H (i.e., $\Delta Z/\Delta H$) is largest is denoted as a magnetic field Hb. The magnetic sensor 1 can measure the amount of change $\Delta H$ in the magnetic field H near the magnetic field Hb with high accuracy. The magnetic field Hb is sometimes called a bias magnetic field.

Hereinafter, the slope of the graph $\Delta Z/\Delta H$ at the magnetic field Hb (i.e., the maximum $\Delta Z/\Delta H$) may be denoted as $S_{max}$. Also, the impedance Z at the magnetic field Hb may be denoted as an impedance Zb, and the impedance in the absence of the application of the magnetic field H (H=O) may be denoted as an impedance ZO. Further, the magnetic field H at which the impedance Z takes a maximum value may be denoted as an anisotropic magnetic field Hk.

The magnetic sensor 1, which measures the amount of change $\Delta H$ in the magnetic field H based on the relationship between the magnetic field H and the impedance Z, has a higher sensitivity when $S_{max}$ is larger. Also, the relationship between the magnetic field H and the impedance Z shown in FIG. 6 indicates that when the anisotropic magnetic field Hk is reduced without changing the maximum value of the impedance Z, the amount of change $\Delta Z$ in the impedance Z becomes steeper and thus $S_{max}$ tends to increase. In other words, the smaller the anisotropic magnetic field Hk is, the higher the sensitivity of the magnetic sensor 1.

As described above, the connecting portion 32 of the magnetic sensor 1 of the present embodiment includes the extended portion 321 and the tapered portions 322, which facilitates the gathering of magnetic lines of force at the sensitive elements 31 and improves the magnetic flux density of the sensitive elements 31. As a result, the anisotropic magnetic field Hk reduces in the magnetic sensor 1 of the present embodiment as compared to the conventional magnetic sensor as shown in FIG. 6, which improves the sensitivity of the magnetic sensor 1.

Additionally, as described above, the magnetic field across the sensitive elements 31 of the magnetic sensor 1 of the present embodiment is uniform across the longitudinal direction, which increases the peak (maximum value) of the impedance Z and, in turn, increases $S_{max}$ to improve the sensitivity.

By the way, the anisotropic magnetic field Hk changes at the magnetic sensor 1 also depending on the width of the sensitive element 31 in the transverse direction, and the sensitivity of the magnetic sensor 1 changes accordingly. In other words, the sensitive element 31, which has the longitudinal and transverse directions and is provided with the uniaxial magnetic anisotropy in the transverse direction, has a magnetic shape anisotropy in the longitudinal direction due to the shape of the sensitive element 31. The narrower the width of the sensitive element 31 in the transverse direction is, the larger the magnetic shape anisotropy in the longitudinal direction. Thus, the narrower the width of the sensitive element 31 in the transverse direction is, the smaller the anisotropic magnetic field Hk at the magnetic sensor 1 and the higher the sensitivity thereof tends to be.

Table 1 lists the anisotropic magnetic field Hk, the maximum value of the amount of change ΔZ in the impedance Z, and $S_{max}$ obtained based on the relationship between the magnetic field and the impedance Z of the sensitive portion 30 as measured by passing a high-frequency current for the magnetic sensor 1 of the present embodiment and the conventional magnetic sensor. Table 1 shows the values for the magnetic sensor 1 of the present embodiment and the conventional magnetic sensor when the width of the sensitive element 31 in the transverse direction was set to 100 μm, 75 μm, and 50 μm. Similarly to FIG. 6, the values shown in Table 1 were measured by passing a high-frequency current of 100 MHz between the terminal portions 33 of the sensitive portion 30 in the magnetic sensor 1 of the present embodiment and in the conventional magnetic sensor.

TABLE 1

| | 100 μm | | 75 μm | | 50 μm | |
|---|---|---|---|---|---|---|
| | CONVENTIONAL EXAMPLE | EXAMPLE | CONVENTIONAL EXAMPLE | EXAMPLE | CONVENTIONAL EXAMPLE | EXAMPLE |
| Hk(Oe) | 7.3 | 7 | 6.8 | 6.2 | 6.4 | 6.1 |
| ΔZ(Ω) | 41 | 77 | 43 | 56 | 58 | 73 |
| Smax(Ω/Oe) | 14 | 39 | 27 | 34 | 36 | 50 |

As shown in Table 1, in the case of the magnetic sensor 1 of the present embodiment, the anisotropic magnetic field Hk reduces with a decrease in the width of the sensitive element 31 in the transverse direction. Additionally, with any width of the sensitive element 31 in the transverse direction, the magnetic sensor 1 of the present embodiment has a lower anisotropic magnetic field Hk and a higher maximum value of ΔZ and a higher $S_{max}$, as compared to the conventional magnetic sensor.

Thus, by virtue of the connecting portion 32 having the above-described shape, the magnetic sensor 1 of the present embodiment achieves an improvement in sensitivity regardless of the width of the sensitive element 31 in the transverse direction. Additionally, the magnetic sensor 1 can have a desired sensitivity through adjustments to the shape of the connecting portion 32 and the width of the sensitive element 31 in the transverse direction.

(Method for Manufacturing the Magnetic Sensor 1)

An exemplary method for manufacturing the magnetic sensor 1 is now described.

FIGS. 7A-7E illustrate an exemplary method for manufacturing the magnetic sensor 1. FIGS. 7A-7E illustrate respective steps in the method for manufacturing the magnetic sensor 1. The steps proceed from FIG. 7A through FIG. 7E. The steps shown in FIGS. 7A-7E are representative and may include additional steps. The illustrations of FIGS. 7A-7E correspond to the cross-sectional view along the II-II line of FIG. 1 as shown in FIG. 2.

As described above, the substrate 10 is a substrate made of a non-magnetic material, examples of which include an oxide substrate such as glass and sapphire, a semiconductor substrate such as silicon, and a metal substrate such as aluminum, stainless steel, and a metal plated with nickel phosphorus. The substrate 10 may be formed with linear grooves or linear protrusions and recesses with a curvature radius Ra of e.g., from 0.1 nm to 100 nm by means of a polishing machine or the like. The direction of these linear grooves or linear protrusions and recesses may be aligned with the direction connecting the north and south poles of the thin-film magnet 20 composed of the hard magnetic material layer 103. This facilitates the crystal growth in the hard magnetic material layer 103 in the direction of the grooves. This in turn helps to cause the easy axis of magnetization of the thin-film magnet 20 composed of the hard magnetic material layer 103 to be oriented in the direction of the grooves (direction connecting the north and south poles of the thin-film magnet 20). In other words, the thin-film magnet 20 can be magnetized more easily.

By way of example, the substrate 10 discussed herein is assumed to be glass with a diameter of about 95 mm and a thickness of about 0.5 mm. In the case where the magnetic sensor 1 is several millimeters square in planar shape, multiple magnetic sensors 1 are manufactured in a batch on the substrate 10 and then divided (cut) into individual magnetic sensors 1. While FIGS. 7A-7E focus on one magnetic sensor 1 depicted at the center of the figures, the figures also depict portions of right and left adjacent magnetic sensors 1. A boundary between two adjacent magnetic sensors 1 is shown by a dash-dotted line in the figures.

Figures 7A, 7B, 7C, 7D, 7E:
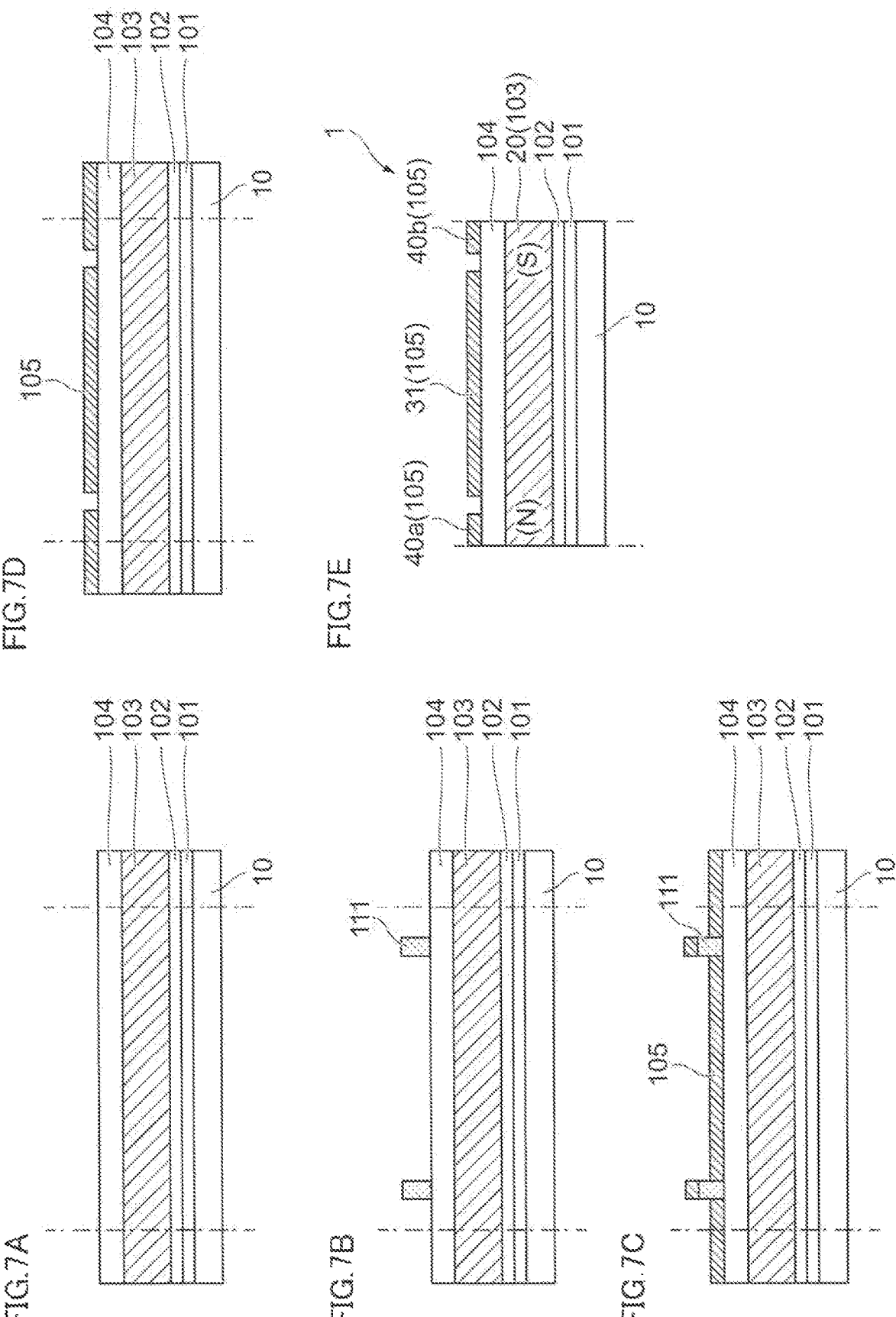
FIGS. 7A-7E illustrate an exemplary method for manufacturing the magnetic sensor.

As shown in FIG. 7A, after cleaning of the substrate 10, the adhesive layer 101, the control layer 102, the hard magnetic material layer 103, and the dielectric layer 104 are deposited (stacked) in this order on one side (hereinafter referred to as a "top side") of the substrate 10 to thereby form a laminate thereon.

First, the adhesive layer 101 of the alloy containing Cr or Ni, the control layer 102 of the alloy containing Cr or the like, and the hard magnetic material layer 103 of the Co alloy constituting the thin-film magnet 20 are successively deposited (stacked) in this order. This deposition may be done by a sputtering method or the like. The substrate 10 is moved to successively face multiple targets made of respective materials, whereby the adhesive layer 101, the control layer 102, and the hard magnetic material layer 103 are laminated in this order on the substrate 10. As described above, the substrate 10 may be heated to e.g., 100° C. to 600° C. during formation of the control layer 102 and the hard magnetic material layer 103 to facilitate the crystal growth.

The substrate 10 may or may not be heated during the deposition of the adhesive layer 101. The substrate 10 may be heated prior to the deposition of the adhesive layer 101 to remove moisture or the like adhering to the top side of the substrate 10.

Then, the dielectric layer 104, which is e.g., an oxide such as $SiO_2$, $Al_2O_3$ and $TiO_2$ or a nitride such as $Si_3N_4$ and AlN, is deposited (stacked). The deposition of the dielectric layer 104 may be done by a plasma CVD method, a reactive sputtering method, or the like.

As shown in FIG. 7B, a photoresist pattern (resist pattern) 111 is formed using any known photolithography technique.

The resist pattern 111 includes openings at positions where the sensitive portion 30 and the yokes 40 (yokes 40a, 40b) are to be formed. In the present embodiment, the shape of the connecting portion 32 described above can be achieved by controlling the shape of the resist pattern 111.

Subsequently, as shown in FIG. 7C, the soft magnetic material layer 105 of the Co alloy constituting the sensitive portion 30 is deposited (stacked). The soft magnetic material layer 105 can be deposited using a sputtering method, for example.

As shown in FIG. 7D, the resist pattern 111 is removed, and also the soft magnetic material layer 105 on the resist pattern 111 is removed (lifted off). As a result, the sensitive portion 30 and the yokes 40 (yokes 40a, 40b) composed of the soft magnetic material layer 105 are formed. In other words, the sensitive portion 30 and the yokes 40 are formed by a single deposition of the soft magnetic material layer 105.

Thereafter, the soft magnetic material layer 105 is provided with uniaxial magnetic anisotropy in the transverse direction of the sensitive elements 31 of the sensitive portion 30 (see FIG. 3). This impartation of the uniaxial magnetic anisotropy to the soft magnetic material layer 105 can be done by, for example, heat treatment at 400° C. in a rotating magnetic field of 3 kG (0.3T) (heat treatment in a rotating magnetic field) and subsequent heat treatment at 400° C. in a static magnetic field of 3 kG (0.3T) (heat treatment in a static magnetic field). At this time, similar uniaxial magnetic anisotropy is imparted to the soft magnetic material layer 105 constituting the yokes 40. However, the yokes 40 may not be provided with the uniaxial magnetic anisotropy because the yokes 40 are only required to serve as a magnetic circuit.

Then, the hard magnetic material layer 103 constituting the thin-film magnet 20 is magnetized. This magnetization of the hard magnetic material layer 103 can be done by applying a magnetic field larger than a coercive force of the hard magnetic material layer 103 in a static magnetic field or a pulsed magnetic field until the magnetization of the hard magnetic material layer 103 is saturated.

Subsequently, as shown in FIG. 7E, multiple magnetic sensors 1 formed on the substrate 10 are divided (cut) into individual magnetic sensors 1. In other words, the substrate 10, the adhesive layer 101, the control layer 102, the hard magnetic material layer 103, the dielectric layer 104, and the soft magnetic material layer 105 are cut such that each magnetic sensor 1 has a square planar shape as shown in the plan view of FIG. 1. This results in the magnetic poles (north pole and south pole) of the thin-film magnet 20 being exposed on respective lateral sides of the divided (cut) hard magnetic material layer 103. Thus, the magnetized hard magnetic material layer 103 becomes the thin-film magnet 20. This division (cutting) can be done by a dicing method, a laser cutting method, or the like.

Note that an etching step of removing the adhesive layer 101, the control layer 102, the hard magnetic material layer 103, the dielectric layer 104, and the soft magnetic material layer 105 between adjacent magnetic sensors 1 on the substrate 10 so as to shape these layers into a square planar shape (planar shape of the magnetic sensor 1 shown in FIG. 1) may take place before the step of dividing the multiple magnetic sensors 1 into individual magnetic sensors 1 shown in FIG. 7E. Then, the exposed substrate 10 may be divided (cut).

Still alternatively, after the step of forming the laminate shown in FIG. 7A, the adhesive layer 101, the control layer 102, the hard magnetic material layer 103, and the dielectric layer 104 may be processed to have a square planar shape (planar shape of the magnetic sensor 1 shown in FIG. 1).

As compared to these methods, the manufacturing method shown in FIGS. 7A-7E involves simplified steps.

The magnetic sensor 1 is thus manufactured. Note that the impartation of the uniaxial magnetic anisotropy to the soft magnetic material layer 105 and/or the magnetization of the thin-film magnet 20 may be performed for each magnetic sensor 1 or multiple magnetic sensors 1 after the step of dividing the magnetic sensors 1 into individual magnetic sensors 1 shown in FIG. 7E.

In the absence of the control layer 102, it would be necessary to heat the hard magnetic material layer 103 to 800° C. or more after the deposition thereof to bring about crystal growth and thereby impart the in-plane magnetic anisotropy. In contrast, providing the control layer 102, as in the magnetic sensor 1 of the present embodiment, eliminates the need for bringing about such crystal growth at a high temperature of 800° C. or more because the control layer 102 can facilitate the crystal growth.

The impartation of the uniaxial magnetic anisotropy to the sensitive elements 31 may be done by a magnetron sputtering method during the stacking of the soft magnetic material layer 105 of the Co alloy constituting the sensitive portion 30, instead of the aforementioned heat treatment in the rotating magnetic field and heat treatment in the static magnetic field. The magnetron sputtering method forms a magnetic field using magnets and confines electrons generated by discharge to a surface of a target. The method thus increases the probability of collisions between the electrons and a gas to facilitate ionization of the gas, thereby increasing the film deposition rate. The magnetic field formed by the magnets used in the magnetron sputtering method imparts the uniaxial magnetic anisotropy to the soft magnetic material layer 105 concurrently with the deposition thereof. As such, the magnetron sputtering method allows omission of the step of imparting the uniaxial magnetic anisotropy through the heat treatment in the rotating magnetic field and the heat treatment in the static magnetic field.

While the exemplary embodiment of the present invention has been described above, various modifications may be made without departing from the spirit of the present invention.

For example, while all connecting portions 32 in the sensitive portion 30 of the above embodiment include the extended portion 321 and the tapered portions 322, at least one of the plurality of connecting portions 32 may have the above-described structure, and the other connecting portions 32 may be, for example, rectangular as in the conventional example. Also, while in the above embodiment the two sides 322a, 322b of the tapered portion 322 are linear, the two sides 322a, 322b are not necessarily linear, provided that the tapered portion 322 has a shape whose width in the transverse direction narrows as it approaches the corresponding end of the sensitive element 31 along the longitudinal direction. As a further modification, the sensitive portion 30 may be composed of a plurality of soft magnetic material layers 105 that are antiferromagnetically coupled across a demagnetizing field suppression layer made of Ru or an Ru alloy. This enhances the magnetic impedance effect of the sensitive elements 31 and thus improves the sensitivity of the magnetic sensor 1.

REFERENCE SIGNS LIST

1 Magnetic sensor
10 Substrate

20 Thin-film magnet
30 Sensitive portion
31 Sensitive element
32 Connecting portion
33 Terminal portion
40, 40a, 40b Yoke
101 Adhesive layer
102 Control layer
103 Hard magnetic material layer
104 Dielectric layer
105 Soft magnetic material layer
321 Extended portion
322 Tapered portion

The invention claimed is:

1. A magnetic sensor comprising:
a plurality of sensitive elements made of a soft magnetic material, the plurality of sensitive elements having a longitudinal direction and a transverse direction, the plurality of sensitive elements having a uniaxial magnetic anisotropy in a direction intersecting the longitudinal direction, the plurality of sensitive elements being configured to sense, by a magnetic impedance effect, a magnetic field applied in the longitudinal direction, the plurality of sensitive elements being arranged with a gap in between in the transverse direction; and
a connecting portion configured to connect longitudinal ends of transversely adjacent ones of the plurality of sensitive elements, wherein
the connecting portion comprises an extended portion with a uniform width in the longitudinal direction and tapered portions that have a width in the transverse direction that narrows as the connecting portion approaches a center portion of the ones of the plurality of sensitive elements along the longitudinal direction, the connecting portion inducing magnetic lines of force into the longitudinal ends of the plurality of sensitive elements, the extended portion extending along the transverse direction and protruding in the transverse direction relative to the ones of the plurality of sensitive elements, the tapered portions connecting the extended portion with longitudinal ends of the plurality of sensitive elements.

2. The magnetic sensor according to claim 1, wherein
the extended portion of the connecting portion has a width in the longitudinal direction that is equal to or larger than a width of each of the plurality of sensitive elements in the transverse direction.

3. The magnetic sensor according to claim 1, wherein
the magnetic sensor comprises a plurality of the connecting portions,
the plurality of sensitive elements are connected by the plurality of the connecting portions in series in a serpentine pattern, and
each connecting portion of the plurality of the connecting portions comprises the extended portion and the tapered portions, and each of the tapered portions has a width in the transverse direction that narrows as the connecting portion approaches corresponding ones of the plurality of sensitive elements along the longitudinal direction.

4. The magnetic sensor according to claim 1, wherein
the magnetic sensor comprises a plurality of the connecting portions,
the plurality of sensitive elements are connected by the plurality of the connecting portions in series in a serpentine pattern, and each connecting portion of the plurality of the connecting portions comprises the extended portion and the tapered portions, and each of the tapered portions has a width in the transverse direction that narrows as the connecting portion approaches corresponding ones of the plurality of sensitive elements along the longitudinal direction.

5. The magnetic sensor according to claim 2, wherein
the magnetic sensor comprises a plurality of the connecting portions,
the plurality of sensitive elements are connected by the plurality of the connecting portions in series in a serpentine pattern, and
each connecting portion of the plurality of the connecting portions comprises the extended portion and the tapered portions, and each of the tapered portions has a width in the transverse direction that narrows as the connecting portion approaches corresponding ones of the plurality of sensitive elements along the longitudinal direction.

6. The magnetic sensor according to claim 1, wherein the connecting portion has the tapered portion having a width in the transverse direction that narrows as the connecting portion approaches a center portion of the ones of the plurality of sensitive elements along the longitudinal direction, an inclination angle of the tapered portion with respect to the longitudinal direction ranging from 110 degree to 150 degree.

7. A magnetic sensor comprising:
a plurality of sensitive elements made of a soft magnetic material, the plurality of sensitive elements having a longitudinal direction and a transverse direction, the plurality of sensitive elements having a uniaxial magnetic anisotropy in a direction intersecting the longitudinal direction, the plurality of sensitive elements being configured to sense, by a magnetic impedance effect, a magnetic field applied in the longitudinal direction, the plurality of sensitive elements being arranged with a gap in between in the transverse direction; and
a connecting portion configured to connect longitudinal ends of transversely adjacent two of the plurality of sensitive elements, wherein
the connecting portion comprises an extended portion that has a uniform width in the longitudinal direction and protrudes in the transverse direction relative to the two of the plurality of sensitive elements that the connecting portion connects; and tapered portions that connect the extended portion with longitudinal ends of the plurality of sensitive elements and have a width in the transverse direction that narrows as the connecting portion approaches a center portion of the ones of the plurality of sensitive elements along the longitudinal direction, and
a length of the connecting portion in the transverse direction is longer than a combined length of widths of the two of the plurality of sensitive elements in the transverse direction and a gap between the two of the plurality of sensitive elements in the transverse direction, and
the connecting portion gathers a magnetic lines of force to the connecting portion from both sides in the transverse direction.

* * * * *